United States Patent [19]

Harwood et al.

[11] 4,229,759
[45] Oct. 21, 1980

[54] SIGNAL DETECTOR INCLUDING SAMPLE AND HOLD CIRCUIT WITH REDUCED OFFSET ERROR

[75] Inventors: Leopold A. Harwood, Bridgewater; Erwin J. Wittmann, North Plainfield, both of N.J.

[73] Assignee: RCA Corporation, New York, N.Y.

[21] Appl. No.: 936,039

[22] Filed: Aug. 23, 1978

[51] Int. Cl.³ .......................... H04N 9/46; H03B 3/04
[52] U.S. Cl. ...................................... 358/19; 331/20; 331/25
[58] Field of Search ................... 358/19, 23, 21 V, 27, 358/28, 26; 331/18, 20, 23, 25; 307/232, 295; 329/50, 103; 328/134

[56] References Cited

U.S. PATENT DOCUMENTS

| 3,585,285 | 6/1971 | Rennick | 358/28 |
| 3,740,456 | 6/1973 | Harwood | 358/19 |
| 3,860,954 | 1/1975 | Tsuchiya | 358/19 |
| 4,056,826 | 11/1977 | Watanabe et al. | 358/19 |

Primary Examiner—John C. Martin
Attorney, Agent, or Firm—Eugene M. Whitacre; William H. Meagher; Ronald H. Kurdyla

[57] ABSTRACT

A sample and hold detector arrangement suitable for construction in integrated circuit form as an automatic chroma gain control detector, or a color oscillator AFPC detector, or the like. A wide bandwidth analog multiplier circuit is supplied with an intermittent reference signal and a second signal, the phase or amplitude of which is to be sampled. In a preferred embodiment, the reference signal corresponds to the burst component of a composite color television signal and the second signal corresponds to a locally generated color subcarrier signal. The multiplier provides oppositely phased output signals which are coupled to first and second sample and hold circuits. Each sample and hold circuit is keyed to concurrently sample the respective multiplier outputs for the same sampling interval, and each provides substantially symmetrical bidirectional conduction to associated filter capacitors during the sampling interval and a high holding impedance during the remainder of each cycle.

13 Claims, 1 Drawing Figure

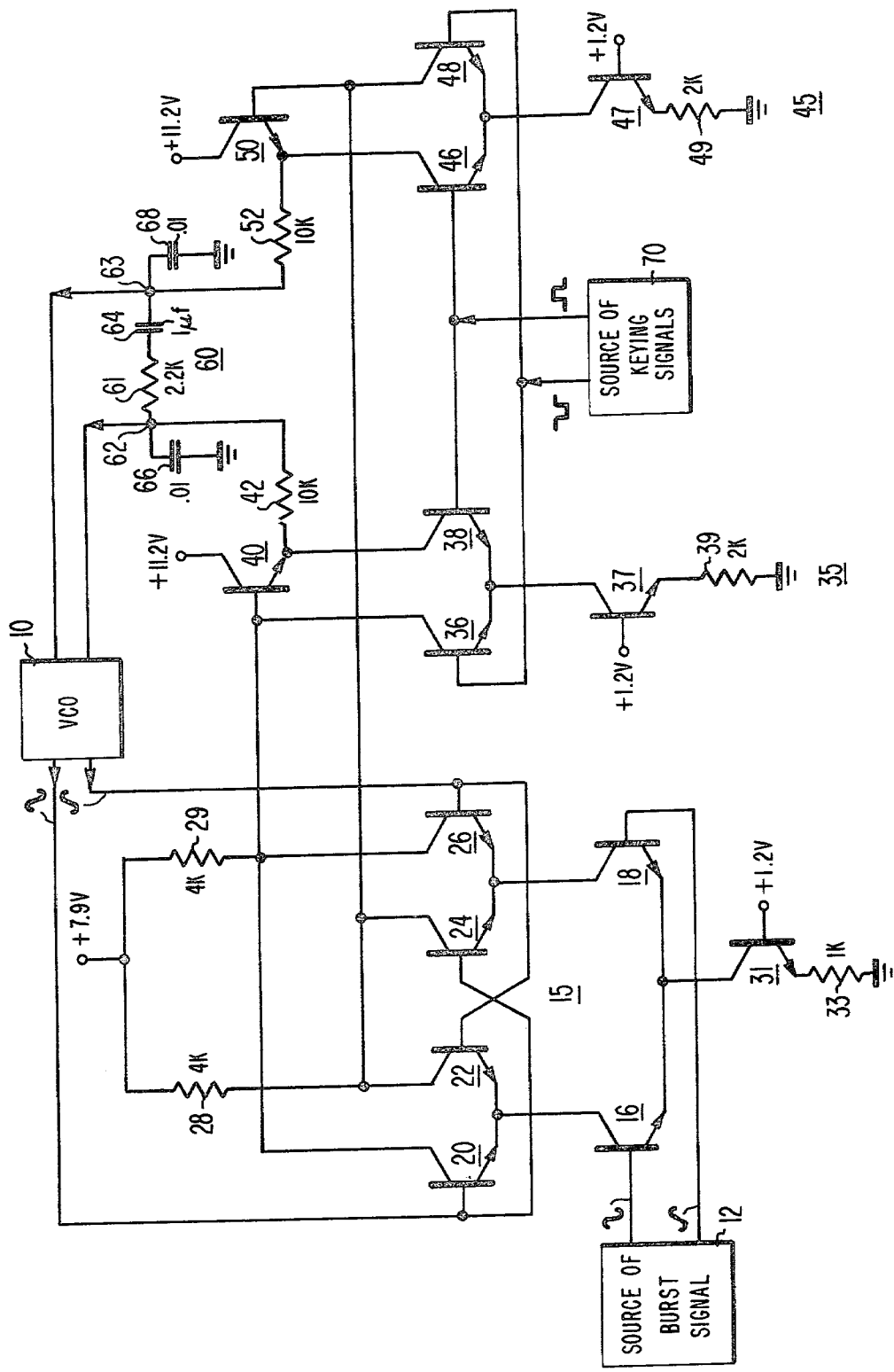

SIGNAL DETECTOR INCLUDING SAMPLE AND HOLD CIRCUIT WITH REDUCED OFFSET ERROR

This invention relates to electronic signal processing circuits including sample and hold circuits for producing a control signal with minimum offset error and, in particular, to such circuits of a type which readily may be constructed in monolithic, integrated form and are useful, for example, in color television receivers.

In many different types of electrical apparatus, there is a requirement that a particular characteristic of a signal (e.g., amplitude, relative phase, frequency) be sampled at intervals to provide an output, such as a voltage, representative to the sampled characteristic. In the integrated circuit environment, synchronous sampling or detection often is performed by means of analog multiplier circuits. Typically, such detectors include a resistance-capacitance load circuit having a time constant selected according to the nature of the information to be detected. If the sampling intervals are relatively widely spaced compared to their duration (i.e., a low duty cycle), the detector should provide high gain in order to produce a usable average output voltage across the filter network. Low duty cycle sampling is encountered, for example, in a color television receiver wherein balanced, synchronous detectors are employed for detecting the amplitude and/or the relative phase (as compared to a local oscillator output) of received color synchronizing burst signals. These cynchronous detectors are used to provide automatic chroma control (ACC) and oscillator synchronization (AFPC) signals, respectively.

Under the broadcast standards employed in the United States, which are typical standards for purposes of the present discussion, color burst information is transmitted during a synchronizing interval following the end of each image-representative portion of the signal corresponding to a horizontal scanning line. The color burst consists of eight or more cycles of a waveform having a frequency equal to that of a transmitted color subcarrier (approximately 3.58 MHz). A line scanning interval (including image and synchronizing portions) is 63.5 microseconds in duration. The color burst information is present only for a time interval of approximately two and a half microseconds and is absent for the remainder (approximately sixty microseconds) of each line scanning interval.

In order to provide the desired high detection gain, previous detectors have employed a combination of an external filter capacitor and a relatively large, external, discrete resistor as the detector load. Because the thermal characteristics of internal and external resistors are generally dissimilar, it is difficult to produce predictable operating characteristics for integrated circuits employing external gain-determining components unless some provision is made for adjustment of the external components. As is well known, variable discrete components are relatively costly and, in addition, may necessitate use of one of the relatively few terminals available for connection between circuits inside and outside the confines of an integrated circuit chip. It is therefore generally desirable in the design of integrated circuits to minimize the number of external components associated with such circuits and, in particular to minimize external adjustable or gain determining elements if possible.

The desired predictable, high gain characteristics can be obtained without the need for external load resistors or gain adjustment components by employing a sampling detector of the type described in U.S. Pat. No. 3,740,456—Harwood. The detector described in this patent also comprises a sample and hold circuit arrangement wherein a capacitor is coupled intermittently to a source of signals which are to be sampled, and between sampling intervals the capacitor stores the sampled information. In order to insure predictable sampling and the desired storage between sampling, the coupling circuit switches between a predictable charging (sampling) impedance and a relatively high "holding" impendance. Furthermore, since the signal to be sampled may either increase or decrease between sampling intervals, the coupling circuit is capable of either charging or discharging the associated capacitor in a substantially linear and symmetrical manner to insure similar responses to either change in the signal to be sampled. Still further, the transition between the sample and hold modes of operation is relatively rapid to avoid loss of information during the transition.

Since the control voltage provided by a sampling detector circuit typically is used to control the operation of other signal processing circuits, proper operation of these signal processing circuits requires that any offset error voltage contained in the control signal be reduced to an acceptable minimum. Otherwise, the error component may impair or obscure the control voltage such that the effectiveness of the circuits responsive to the control voltage will be compromised. For similar reasons, a sampling detector should exhibit substantially noise immune performance.

In accordance with the present invention, a sampling detector which exhibits the above-noted features is provided.

The sampling detector includes a sample and hold network, and a signal multiplier having a first input coupled to a source of reference signals, a second input coupled to a source of signals having a characteristic to be sampled, and first and second oppositely phased outputs. The sample and hold network comprises first and second sampling circuits each coupled to respective outputs of the multiplier, and a charge storage filter network. The sampling circuits operate concurrently between relatively low and high impedance states for alternately coupling the filter network to the multiplier outputs for sampling signals appearing at the multiplier outputs, and for decoupling the filter network from the multiplier outputs so as to store information representative of the sampled characteristic at the filter network.

In accordance with a feature of the invention, the sampling circuits are arranged to provide symmetrical charging and discharging currents to the filter network during the sampling interval. In accordance with a further feature of the invention, the input signals are applied to the multiplier such that the multiplier exhibits balanced operation with respect to the input signals.

The single drawing is a diagram partially in block form and partially in schematic circuit diagram form of a portion of chrominance signal processing circuits of a color television receiver, employing a sampling detector constructed in accordance with the present invention.

In the drawing, the illustrated circuit is used to provide automatic phase and frequency control (AFPC) for a voltage controlled oscillator (VCO) 10. In this example, oscillator 10 is of the type described in U.S.

Pat. No. 4,020,500 of L. A. Harwood and is used to regenerate a continuous wave, color subcarrier reference signal at the chrominance subcarrier frequency of approximately 3.58 MHz, according to United States broadcast standards, or at another frequency according to the broadcast signal standards of a particular locality.

A source 12 provides a color burst component separated from the composite color television signal. The color burst component typically comprises eight or more cycles of unmodulated color subcarrier locked in phase with the suppressed chrominance subcarrier component of the composite color television signal, and transmitted during the synchronizing interval following the end of each line of image information of the transmitted television signal. Burst source 12 may comprise a burst separator amplifier of the type described in U.S. Pat. No. 4,038,681 of L. A. Harwood.

Complementary phase (push-pull) output signals from oscillator 10 and complementary phase separated burst signals from source 12 are supplied to inputs of a balanced, synchronous phase detector 15 of the multiplier type. Detector 15 comprises a first pair of lower rank differentially connected transistors 16, 18, and second and third pairs of upper rank differentially connected transistors 20, 22 and 24, 26, all arranged as shown. Complementary phase burst signals are respectively applied to the base input electrodes of transistors 16, 18 and the complementary phase oscillator signals are respectively coupled to the base input electrodes of upper rank transistors 20, 24 and 22, 26. Operating currents for detector 15 are supplied by a source of substantially constant current comprising a transistor 31 coupled to the joined emitters of transistors 16, 18 and an associated resistor 33.

Wideband output signals produced by detector 15 are representative of the phase and/or frequency difference between the applied reference signal from oscillator 10 and the burst component from source 12. These output signals are mutually oppositely phased and appear across respective load resistors 28 and 29, which are coupled between an operating supply voltage (+7.9 volts) and the interconnected collector output electrodes of transistors 22, 24 and 20, 26, respectively. Unfiltered output signals produced across load resistors 28 and 29 are D.C. coupled to first and second sample and hold circuits 45 and 35, respectively.

Signals developed across output resistor 29 are coupled to a base input of a keyed emitter follower transistor 40 of sampling circuit 35. The emitter output of follower transistor 40 is in turn coupled via a resistor 42 to a filter network 60 including a first filter capacitor 66 coupled between a first output terminal 62 and ground. Sample and hold circuit 35 further comprises a differential switching circuit having first and second switching transistors 36, 38 arranged in differential configuration, and an associated current source including a transistor 37 and a resistor 39. The collector electrodes of transistors 36, 38 are respectively coupled to the base and emitter electrodes of follower transistor 40 to control the conduction of follower 40 in accordance with the switching action of transistors 36, 38, as will be discussed.

The switching action of transistors 36, 38 is controlled by complementary phase keying pulses applied to the base input electrodes of transistors 36, 38 from a source 70. These pulses, with the relative polarities shown, serve to render transistors 36 and 38 respectively non-conductive and conductive during the desired signal sampling (e.g., color burst) interval, and vice-versa during the remainder of each operating cycle.

In this example, the second sample and hold circuit is identical to sampling circuit 35 for sampling signals developed across output resistor 28 of detector 15. The latter signals are supplied to the base input of a keyed follower transistor 50, an emitter output of which is coupled via a resistor 52 to a second filter capacitor 68 coupled between a second output terminal 63 and ground. A differential switching circuit including differential switching transistors 46, 48 and a current source comprising a transistor 47 and an associated resistor 49 is also included. The collector output electrodes of transistors 46, 48 are respectively coupled to the emitter and base electrodes of follower transistor 50 to control the conduction thereof in accordance with the switching action of transistors 46, 48. These transistors are switched at the same time as transistors 36, 38 of sampling circuit 35 in response to the keying pulses from source 70 coupled to the base input electrodes of transistors 46, 48.

The information which is to be detected by the illustrated system occurs during only a portion (i.e., the sampling interval) of each operating cycle. In the case of a color television system where the phase of the color reference burst is to be detected, the operating cycle corresponds to each line scanning cycle, the burst sampling interval occurring near the end of each such cycle following the transmission of image-representative signals. The keying pulses therefore recur at the line scanning rate (approximately 15,734 Hz according to U.S. standards) and have a duration of the order of four microseconds centered around the burst interval.

A differential output control voltage, developed between terminals 62 and 63 as will be discussed, is coupled to a control input of oscillator 10 to control the phase and/or frequency operating characteristics of oscillator 10 in accordance with the magnitude and polarity of the control voltage across terminals 62 and 63. The differential control voltage is representative of sampled signals developed at the emitters of transistors 40 and 50 and coupled to filter capacitors 66 and 68 via resistors 42 and 52, respectively.

Resistors 42 and 52 are of the same value, and filter capacitors 66 and 68 are also of the same value in the illustrated preferred arrangement. Network 60 also includes an anti-hunt (damping) network comprising a series combination of a resistor 61 and a capacitor 64 coupled between differential output terminals 62 and 63. The anti-hunt network is not required for all types of detectors but is useful in the context of color oscillator control to reduce the effect of transient disturbances on the oscillator particularly during the vertical image retrace interval when burst information is absent.

With regard to the operation of sample and hold circuit 35, capacitor 66 is charged via the emitter of transistor 40 and resistor 42, and discharges via resistor 42 and the collector-emitter path of transistor 38. When mutually oppositely phase positive and negative keying pulses (as shown) are applied to the base electrodes of transistors 36 and 38 during the burst sampling interval, switching transistors 36 and 38 are rendered non-conductive and conductive, respectively. The quiescent current supplied from current source transistor 37 then flows entirely through transistor 38. The collector potentials of transistors 36, 38 are then of a polarity to forward bias the base-emitter junction of transistor 40, causing transistor 40 to conduct. The emitter voltage of transistor 40 at this time is proportional to the voltage then appearing across load resistor 29 of detector 15. Filter capacitor 66 then charges toward the emitter voltage of transistor 40 via filter resistor 42. Capacitor 66 discharges through resistor 42 and transistor 38 during the sampling interval when the voltage then appearing at the emitter of transistor 40 is lower than the voltage stored on capacitor 66.

When the sampling interval ends, the relative polarities of the keying pulses reverse such that transistors 36 and 38 are rendered conductive and non-conductive, respectively. At this time, corresponding to the "holding" interval, the base-emitter junction of transistor 40 is reverse biased such that transistor 40 is cut-off. Since transistors 38 and 40 are cut-off, the discharge path for capacitor 66 through resistor 42 and transistor 38 is approximately an open circuit. Therefore, capacitor 66 holds its charge until transistor 38 is again keyed on during the next sampling (burst) interval.

It is noted that the described operation of sample and hold circuit 35 achieves symmetrical charging and discharging of filter capacitor 66 via resistor 42 with respect to a given quiescent level. Thus, the charge stored on capacitor 66 accurately represents the magnitude of detected signals of either polarity from detector 15. Sample and hold circuit 45 operates in the same manner as circuit 35 described above, to achieve symmetrical charging and discharging of capacitor 68 via resistor 52.

Detector 15 produces no change in the normal quiescent output voltage across resistors 28 and 29, and therefore no change is produced in the differential output control voltage between terminals 62 and 63, whenever the burst and oscillator reference input signals to detector 15 differ in phase by ±90 degrees (i.e., quadrature) under normal conditions. The differential control voltage from terminals 62, 63 is applied to inputs of a differential amplifier included in a differential controllable phase shift network of oscillator 10, as described in detail in U.S. Pat. No. 4,020,500. Under this condition, the voltages developed across resistors 28 and 29 are substantially equal, and the voltages at terminals 62 and 63 are substantially equal, and no change in the oscillator phase or frequency is produced.

If the oscillator frequency and/or phase is not related to the burst component in this manner, repetitive voltage pulses which vary from the normal quiescent level and which are representative of a deviation from the normal (quadrature) signal condition are produced across detector load resistors 28 and 29. These pulses appear during each burst (sampling) interval while the deviation exists. The polarity of the pulses with respect to the quiescent reference level is representative of whether the oscillator phase is leading or lagging the burst component.

Considering sampling circuit 35 alone for example, if the polarity of the oppositely phased signal produced between detector resistors 28 and 29 is such that the base voltage of follower transistor 40 becomes more positive than the normal quiescent level (or more positive than a previous deviation condition), transistor 40 conducts during the sampling interval and charges capacitor 66 via resistor 42 to a correspondingly more positive voltage. The differential, controllable phase shifter network of oscillator 10 produces a corresponding change in phase to reduce the phase (or frequency) deviation of oscillator 10 towards zero.

If, on the other hand, the output voltage of detector 15 is such that the base voltage of follower transistor 40 becomes less positive than during a preceding sampling interval, transistor 40 continues to conduct but, since the emitter of transistor 40 will be at a lower voltage than is stored across capacitor 66, capacitor 66 discharges through resistor 42 and the collector-emitter path of transistor 38, the latter having been rendered conductive during the burst sampling interval as was explained above. An appropriate differential control voltage is therefore applied to oscillator 10 to reduce the oscillator deviation towards zero.

Observations analogous to the above also apply to sample and hold circuit 45, which is identical to and operates in the same manner as sample and hold circuit 35. In each case, filter capacitors 66 an' 68 are charged or discharged during the sampling interv ls by means of like, bidirectionally conductive current paths, in accordance with the polarity of the oppositely phased output signal developed by detector 15. In each case, the principal charging and discharging paths during the sampling intervals includes a resistor (42 or .) and a transistor current supply (40 or 38 in one case and 50 or 56 in the other). The illustrated arrangement therefore responds to signal deviations of either polarity with substantially equal facility. In this connection, it is noted that equal value filter resistors 42 and 52 correspond to a source impedance with regard to the charging and discharging of capacitors 66 and 68, respectively. These resistors serve to meter the charging and discharging current levels of capacitors 66 and 68 so that these levels are equalized for opposite polarities of a given level from the output of detector 15. Accordingly, resistors 42 and 52 assist to promote symmetrical operation of the sample and hold circuits.

It is noted that the effectiveness of a sampling detector arrangement can be reduced by the presence of an unwanted offset error voltage in the output control signal. The described arrangement reduces the likelihood of such an offset error occurring to an acceptable minimum.

The offset error can be associated with the D.C. component of either or both of the input signals to the synchronous detector, or to the unbalanced operation of the detector itself. With the present arrangement, this type of error is minimized since detector 15 is balanced with respect to both of the applied input signals, whereby such offset error is averaged out, or nullified over the switching cycle of balanced detector 15.

An additional offset error voltage can appear at the output of the detector due to supply voltage variations or temperature induced quiescent voltage changes. In this connection it is noted the oppositely phased outputs of detector 15 serve to minimize the effects of common mode variations of this type. For example, a shift in the level of the operating supply (+7.9 volts) of detector 15 affects the quiescent level appearing across resistors 28 and 29 equally. Although this level shift is translated via sample and hold circuits 35 and 45 to output terminals 62 and 63, the differential voltage developed between these terminals is unaffected. In addition, such common mode offset errors can be nullified by the input common mode rejection capabilities of the circuit to which the differential control voltage is applied (e.g., the differential amplifier input of the controllable phase shift network associated with oscillator 10).

Temperature induced level shifts can produce a similar common mode offset, especially when the particular circuits share a common thermal environment such as in an integrated circuit. In this connection it is noted that the illustrated arrangement is capable of being fabricated as a single monolithic integrated circuit, with the exception of filter network 60 and the frequency determining elements associated with oscillator 10 (not shown). Also in this case, a common mode offset error does not affect the differential output control voltage.

It is also possible for an offset error to be introduced by a mismatch in the values of the load resistors of the detector (e.g., detector 15). In a discrete circuit, this mismatch can be significantly reduced by careful selection of these resistor values. Problems of resistor mismatch are essentially eliminated in an integrated circuit environment, since present integrated circuit manufacturing techniques permit resistor values to be matched with a high degree of accuracy.

The differential control voltage can also exhibit an offset error due to discharging of the "holding" capacitors through the output circuits to which these capacitors are coupled. Illustratively, the charge stored on capacitors 66 and 68 can be reduced via the base current draw of the input transistors of oscillator 10 to which terminals 62 and 63 are coupled. This reduction of the charge stored by capacitors 66, 68 does not alter the differential control voltage, however, since capacitors 66 and 68 are charged (or discharged) for the same amount of time during each sampling interval, and hold the charge for the same time intervals. Thus any reduction in the amount of stored charge which occurs during the "holding" interval via input current drawn by oscillator 10 affects both capacitors equally. The differential control voltage remains unchanged, although the absolute value of the control voltages appearing at control terminals 62 and 63 will be reduced.

A further advantage of the described system is that the differential control voltage need not be further amplified. This advantage is achieved by the manner in which sampling circuits 35 and 45 present a very high impedance to capacitors 66 and 68 during the non-sampling intervals. This action prevents the filter capacitors from then discharging to a level which may require that the differential control voltage be amplified to provide a useable control voltage. In addition to adding to the complexity of the system, an additional gain stage is also undesirable since it may introduce another offset error into the system.

The described arrangement also exhibits excellent noise immune performance. The relatively short sampling interval (compared to the time between sampling intervals) serves to minimize noise contamination of the differential control voltage due to noise present in the signals applied to detector 15. In addition, random noise in the nature of thermal noise does not disturb the control voltage, since the time averaged component of such noise across filter capacitors 66 and 68 is essentially zero due to the symmetrical capacitor charging and discharging capability of sampling circuits 35 and 45 as mentioned previously. For example, noise pulses of equal amplitude and opposite polarity cause the filter capacitors to charge and discharge in substantially equal amounts in response to the opposite polarity pulses, thereby negating the effect of such noise upon the differential control voltage.

The described arrangement also can be employed to provide a control voltage indicative of amplitude differences between applied input signals. Illustratively, the described arrangement can serve as a burst amplitude detector by applying burst signals to synchronous detector 15 as described, and by applying subcarrier reference oscillator signals which are amplitude limited and in-phase with the input burst component. In this instance, the differential control voltage provided across terminals 62 and 63 will indicate the difference in amplitude between the applied burst and subcarrier reference signals, and can be used in a color television receiver for providing automatic color control (ACC) and color killer control.

The described system can be used in a video signal processing system employing other than United States broadcast standards (e.g., PAL broadcast standards). Moreover, the invention is applicable to any system for processing a signal having a characteristic which is to be sampled at intervals.

What is claimed is:

1. Electronic signal processing apparatus comprising:
   a first source of reference signals;
   a second source of signals having a characteristic which is to be sampled;
   signal multiplier means having first and second inputs coupled to said first and second sources, respectively, and first and second oppositely phased outputs;
   a filter network; and
   first and second sampling means operable concurrently between relatively low and high impedance states for alternately coupling said filter network to said multiplier outputs for sampling said characteristic of said signals and for uncoupling said filter network from said multiplier outputs so as to store information representative of said characteristic at said filter network.

2. Apparatus according to claim 1 wherein:
   said filter network comprises first and second series combinations of a resistance and a capacitance respectively coupled to said first and second sampling means; and wherein
   wide bandwidth load impedances are respectively coupled to said oppositely phased multiplier outputs.

3. Apparatus according to claim 2, wherein:
   said first filter resistance comprises the sole current path from said first sampling means to said first filter capacitance during said sampling interval and said sampling means inhibits the current flow in said current path during the remaining portion of each operating cycle; and
   said second filter resistance comprises the sole current path from said second sampling means to said second filter capacitance during said sampling interval and said sampling means inhibits the current flow in said current path during the remaining portion of each operating cycle.

4. Apparatus according to claim 3, wherein:
   said first and second sampling means comprises respective current paths coupled to said filter network for alternatively charging or discharging said first and second capacitances, respectively, during each sampling interval; and
   switching means coupled to said current paths for inhibiting current conduction of said current paths during the remaining portion of each operating cycle.

5. Apparatus according to claim 3, wherein:
   said first and second sampling means each comprises first, second and third switching transistors each having base, emitter and collector electrodes, the base of said first switching transistor being coupled to one of said outputs of said multiplier and the emitter thereof being coupled to said filter network, said second and third switching transistors being differentially coupled together with joined emitter electrodes, the collector of said second switching transistor being coupled to the base of said first switching transistor and the collector of said third switching transistor being coupled to the emiter of said first switching transistor, and a source of keying signals coupled to at least one of the base electrodes of said second and third switching transistors for rendering said third switching transistor conductive and said second switching transistor non-conductive during each sampling interval and for rendering said second switching transistor conductive and said third switching transistor non-conductive during a remaining portion of each operating cycle.

6. Apparatus according to claim 5, wherein:
said filter resistances of said first and second series combinations are respectively coupled to the junction of the emitter of said first switching transistor and the collector of said third switching transistor of each of said first and second sampling means.

7. Apparatus according to claim 5, wherein:
said source of keying signals provides oppositely phased keying signals; and
said oppositely phased keying signals are respectively coupled to said base electrodes of said second and third transistors of each of said first and second sampling means, for rendering said first and second sampling means operable simultaneously for sampling said oppositely phased multiplier outputs.

8. Apparatus according to claim 1, wherein:
said first source of reference signals comprises means for providing a continuous wave at a frequency corresponding to the color subcarrier of a color television signal; and
said second source of signals comprises means for providing a signal including a periodically recurring color synchronizing burst component.

9. Apparatus according to claim 8, wherein:
said first and second sampling means are operative to sample a characteristic of said color burst component and to store information representative of said characteristic at said filter network.

10. Apparatus according to claim 9, wherein:
the sampled characteristic corresponds to the relative phase and frequency of said burst component compared to said continuous wave.

11. Apparatus according to claim 1, wherein:
said first and second signal sources are coupled to said inputs of said signal multiplier means such that said signal multiplier exhibits balanced operation with respect to signals from said first and second sources.

12. Apparatus according to claim 11, wherein said first source supplies complementary phase reference signals and said second source supplies complementary phase signals to be sampled, and wherein said signal multiplier means comprises:
a first differential amplifier comprising first and second transistors having base input electrodes, collector output electrodes and interconnected emitter electrodes;
a second differential amplifier comprising third and fourth transistors each having an emitter electrode coupled to said collector electrode of said first transistor, a base electrode and a collector output electrode;
a third differential amplifier comprising fifth and sixth transistors each having an emitter electrode coupled to said collector electrode of said second transistor, a base electrode, and a collector output electrode;
means for coupling said complementary phase signals to be sampled to said base electrodes of said first and second transistors, respectively;
means for coupling said complementary phase reference signals to said base electrodes of said third and fifth transistors and to said base electrodes of said fourth and sixth transistors, respectively;
a first wide bandwith load impedance coupled to said collector output electrodes of said fourth and fifth transistors for developing a first output signal across said first impedance; and
a second wide bandwidth load impedance coupled to said collector output electrodes of said third and sixth transistors for developing a second output signal across said second impedance, said said second output signal being oppositely phased relative to said first output signal.

13. In a color television receiver for processing a color television signal including a chrominance subcarrier component and a periodic burst sychronizing component occurring during line synchronizing intervals of said television signal and having a characteristic which is to be sampled, said receiver including means for separating said burst component from said television signal; means for generating a continuous wave reference signal at a frequency corresponding to the frequency of said subcarrier component; and apparatus comprising:
signal multiplier means responsive to separated burst components from an output of said separating means and continuously responsive to said continuous wave reference signal, said multiplier means having first and second oppositely phased outputs;
a filter network; and
first and second sampling means operable concurrently between relatively low and high impedance states for alternately coupling said filter network to said multiplier outputs during burst synchronizing intervals of said television signal for sampling said characteristic of said burst component, and for uncoupling said filter network from said multiplier outputs during other intervals of said television signal so as to store information representative of said characteristic at said filter network.

* * * * *